US006642135B2

(12) United States Patent
Kim et al.

(10) Patent No.: US 6,642,135 B2
(45) Date of Patent: Nov. 4, 2003

(54) METHOD FOR FORMING SEMICONDUCTOR MEMORY DEVICE HAVING A FUSE

(75) Inventors: Min-Sang Kim, Seoul (KR);
Dong-Won Shin, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/283,613

(22) Filed: Oct. 29, 2002

(65) Prior Publication Data
US 2003/0153135 A1 Aug. 14, 2003

(30) Foreign Application Priority Data
Feb. 9, 2002 (KR) .......................................... 2002-7695

(51) Int. Cl.[7] .......................................... H01L 21/8242
(52) U.S. Cl. ........................ 438/601; 438/132; 438/215; 438/233; 438/281; 438/631; 438/645
(58) Field of Search ................................. 438/132, 215, 438/233, 281, 601, 631, 637, 645, FOR 187, FOR 433

(56) References Cited

U.S. PATENT DOCUMENTS

| 5,405,800 | A | * | 4/1995 | Ogawa et al. ............... 438/253 |
| 5,620,917 | A | * | 4/1997 | Yoon et al. .................. 438/253 |
| 6,063,669 | A | * | 5/2000 | Takaishi ...................... 438/270 |
| 6,507,086 | B1 | * | 1/2003 | Minn et al. .................. 257/529 |
| 2001/0004549 | A1 | * | 6/2001 | Arndt et al. ................ 438/601 |
| 2001/0005604 | A1 | * | 6/2001 | Lee et al. .................... 438/132 |
| 2001/0055848 | A1 | * | 12/2001 | Minn et al. ................. 438/281 |
| 2002/0005551 | A1 | * | 1/2002 | Ema et al. ................... 257/355 |
| 2002/0061616 | A1 | * | 5/2002 | Kim et al. ................... 438/200 |
| 2002/0086462 | A1 | * | 7/2002 | Kothandaraman et al. .. 438/132 |
| 2002/0086516 | A1 | * | 7/2002 | Hsu et al. .................... 438/617 |
| 2002/0185738 | A1 | * | 12/2002 | Kim et al. ................... 257/758 |

* cited by examiner

Primary Examiner—George Fourson
Assistant Examiner—Joannie Adelle Garcia
(74) Attorney, Agent, or Firm—Marger Johnson & McCollom, P.C.

(57) ABSTRACT

A fabrication method for forming a semiconductor device having a fuse is provided. A substrate includes a cell array area, a peripheral circuit area and a global step difference between the cell array area and the peripheral circuit area. The substrate comprises a fuse formed in the peripheral circuit of the substrate. An interlayer insulating layer is formed on the global step difference. The global step difference is reduced by a cell open process. A multilevel metal interconnection including an intermetal insulating layer is formed on the resultant structure. During the cell open process and/or the process for forming the multilevel metal interconnection, the interlayer insulating layer and/or the intermetal insulating layer is partially removed to form a recess. A passivation layer is formed on the multilevel metal interconnection. A fuse opening is formed through the recess to expose the fuse. The etching amount for forming the fuse opening is significantly reduced by the partial removal of the interlayer insulating layer and/or the intermetal insulating layer.

15 Claims, 16 Drawing Sheets

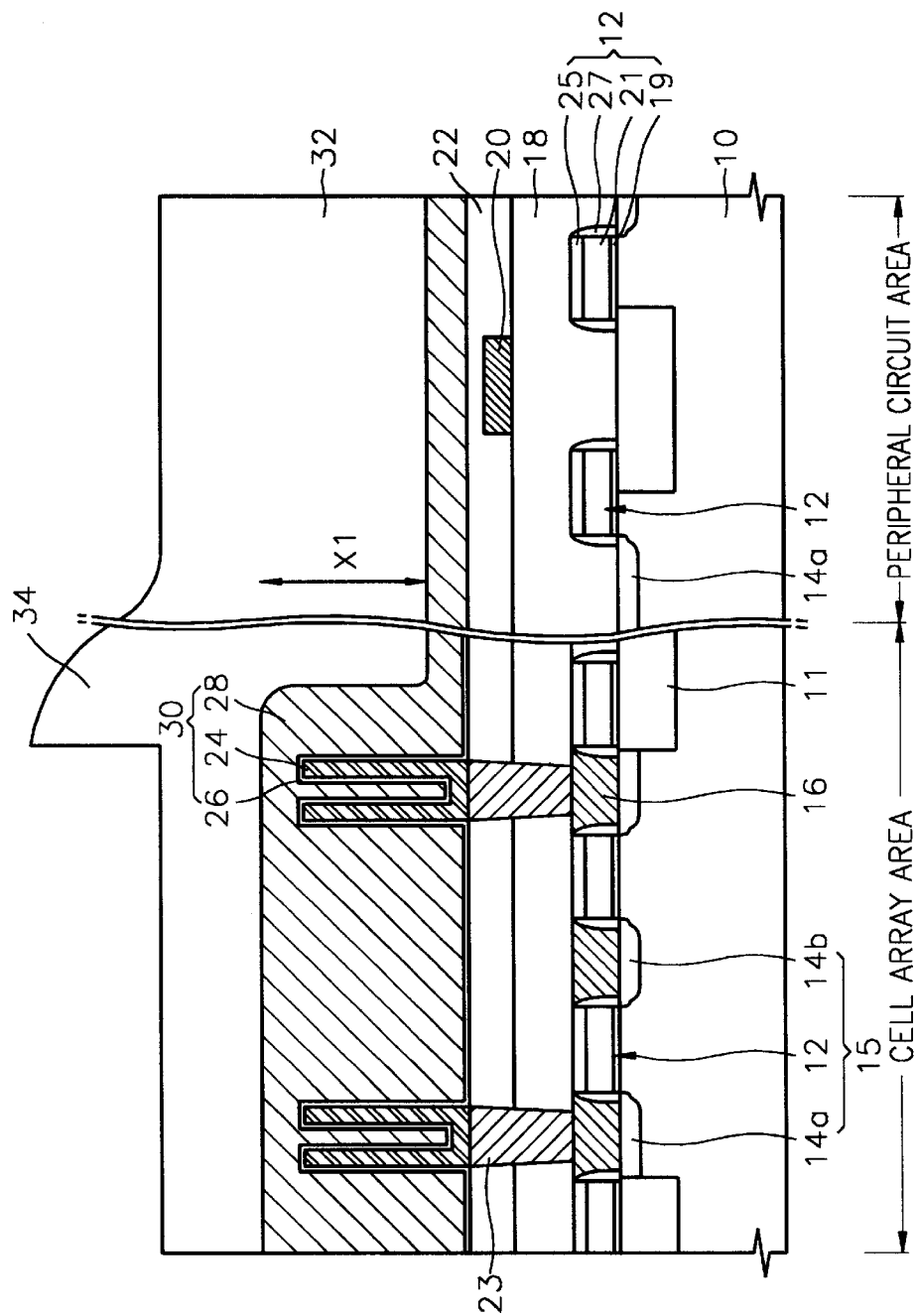

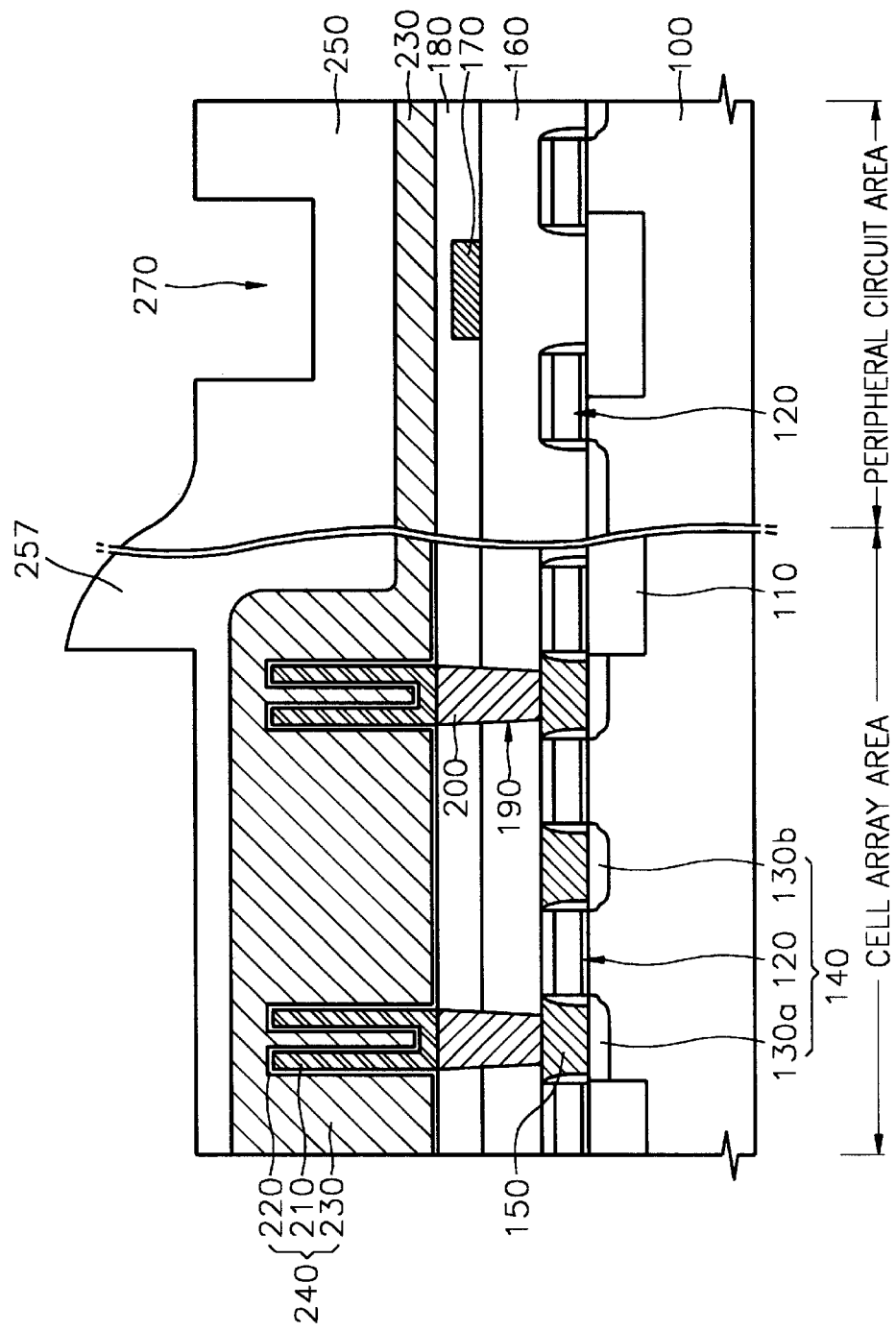

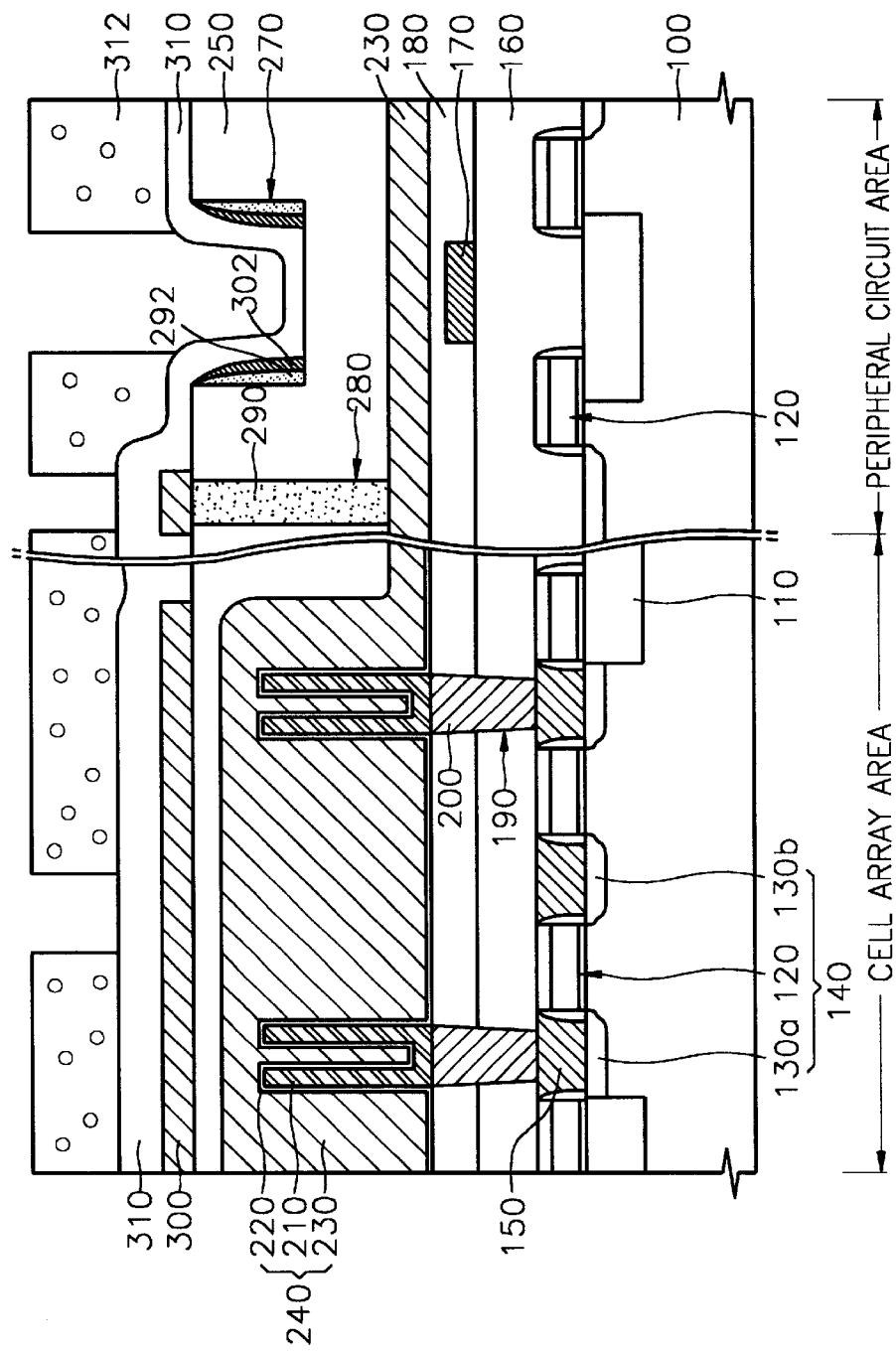

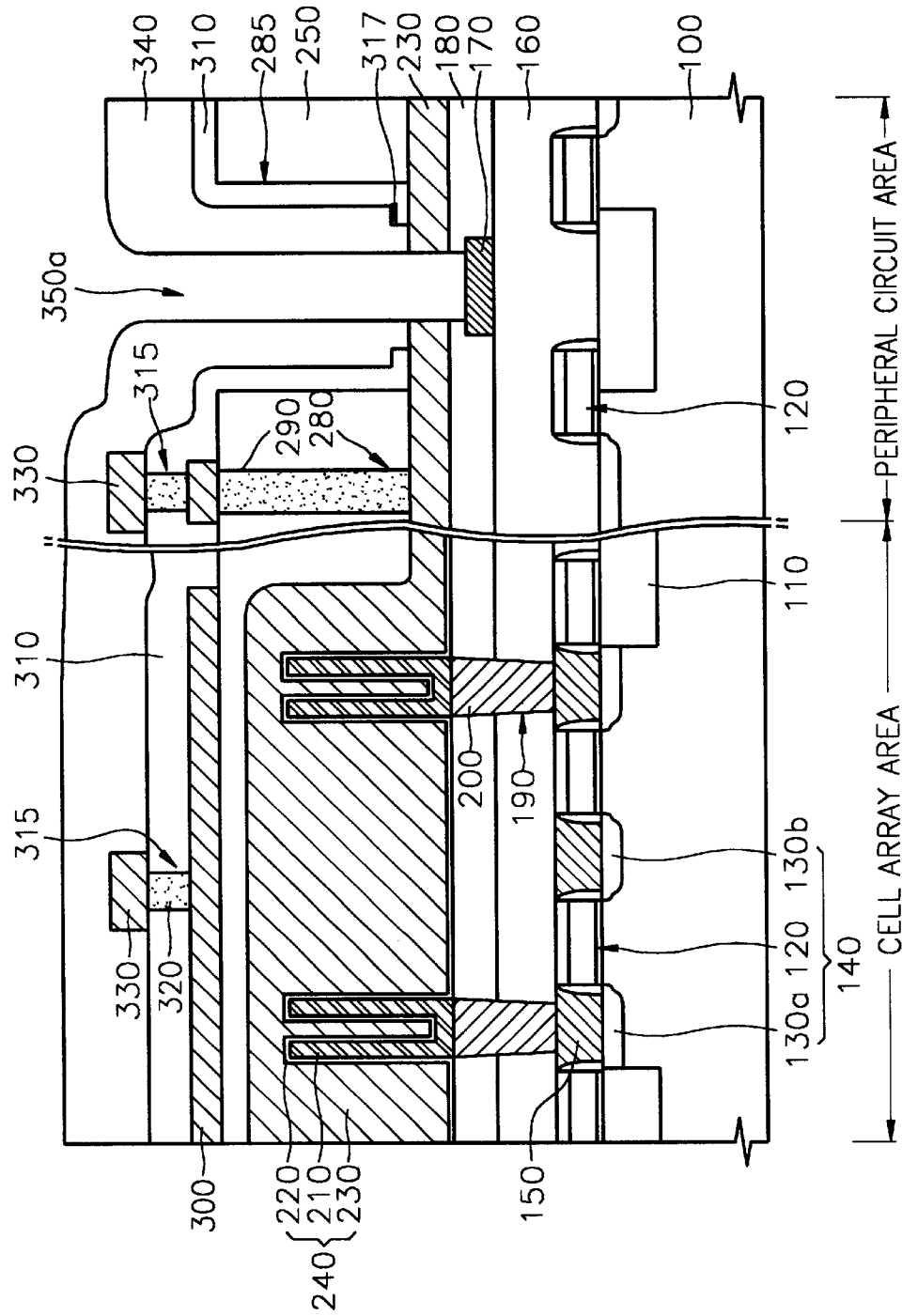

METHOD FOR FORMING SEMICONDUCTOR MEMORY DEVICE HAVING A FUSE

This application relies for priority upon Korean Patent Application No. 2002-7695, filed on Feb. 9, 2002, the contents of which are herein incorporated by reference in their entirety.

FIELD OF THE INVENTION

The present invention relates to method of fabricating a semiconductor device and, more specifically, to a dynamic random access memory (DRAM) device having a fuse.

BACKGROUND OF THE INVENTION

A DRAM device comprises a cell array area and a peripheral circuit area. The cell array area includes a plurality of unit cells, each of which comprises a MOS transistor and a storage capacitor. The peripheral circuit area consists of semiconductor circuits that control operations and input/output of the unit cells, for example a driver, a buffer or an amplifier. The peripheral circuit area usually includes a plurality of fuses, which can be cut by using a laser.

In continuing the trend of higher memory capacity, three-dimensional capacitors have been proposed in an attempt to increase an effective capacitor area in the unit cell. The three-dimensional capacitors have, for example, concave type or cylinder type storage electrodes. The heights of the three-dimensional capacitors are relatively high, as much as 1 μm or more, to retain a desirable cell capacitance of the unit cell and solve problems such as low read-out capability of the cell and low immunity to soft error. However, the heights of the three-dimensional capacitors may induce a high global step difference between the cell array area and the peripheral circuit area. The global step difference may make it difficult to form a metal interconnection, which is usually formed after the formation of the capacitors.

One proposal to reduce the global step difference is to form a thick interlayer insulating layer on the global step difference and make the surface of the interlayer insulating layer planar. FIGS. 1a through 1c are cross-sectional views illustrating successive process steps for forming a fuse opening according to a conventional method. Referring to FIG. 1a, isolation regions 11 are formed on a semiconductor wafer 10, thereby defining active regions. MOS transistors 15 are formed on the semiconductor wafer 10 having the isolation regions 11. Each of the MOS transistors 15 comprises a gate electrode 12, a source 14a and a drain 14b. The sources 14a and the drains 14b are formed in the active regions of the semiconductor wafer 10. The MOS transistors 15 in a cell array area are formed more densely than the MOS transistors 15 in a peripheral circuit area. Each of the gate electrodes 12 comprises a gate dielectric layer 19 formed on the active regions of the semiconductor wafer 10, a gate conductive layer 21 formed on the gate dielectric layer 19, a hard mask layer 25 formed on the gate conductive layer 21 and spacers 27 formed on the sidewalls of the gate conductive layers 21. Between the gate electrodes 12, SAC (self-aligned contact) pads 16 are formed to contact the sources 14a and the drains 14b.

On the resultant structure, a first interlayer insulating layer 18 is formed. On the first interlayer insulating layer 18, bit lines (though not shown) and fuse 20 are formed in the cell array area and in the peripheral circuit area, respectively. The bit lines are electrically connected to the drains 14b.

Though not shown, during formation of the bit line and fuse 20, a local interconnection may be formed simultaneously on the first interlayer insulating layer 18 in the peripheral circuit area.

On the resultant structure, a second interlayer insulating layer 22 is formed. Subsequently, storage contact holes are formed through the first and second interlayer insulating layers 18, 22. The storage contact holes expose the SAC pads 16, which are formed on the sources 14a. Conductive storage contact pads 23 are formed to fill the storage contact holes.

Storage capacitors 30 are formed on the resultant structure. Each of the storage capacitors 30 comprises a concave type storage electrode 24, a capacitor dielectric layer 26 formed on the storage electrode 24 and a plate electrode 28 formed on the capacitor dielectric layer 26. The concave type storage electrodes 24 are formed to electrically contact to the storage contact pads 23. The storage electrodes 24 are formed only in the cell array area, while the plate electrode 28 is formed in both the cell array area and the peripheral circuit area. As a result, as shown in the drawing, a first global step difference X1 is generated. Though not shown, the plate electrode 28 may be formed only in the cell array area. In this case, the first global step difference XI may be greater compared to that in case of that the plate electrode 28 is formed both in the cell array area and in the peripheral circuit area.

A third interlayer insulating layer 32 is formed on the plate electrode 28. The third interlayer insulating layer 32 is thick enough to bury the first global step difference X1. That is to say, the thickness of the third interlayer insulating layer 32 is greater than the first global step difference X1. The third interlayer insulating layer 32 may be formed by a method to make the top surface of the resultant structure planarized to some extent, so that a second global step difference X1' of the resultant structure can be smaller than the first global step difference X1. However, it is very difficult to completely remove the second global step difference X1'.

Referring to FIG. 1b, a top portion of the third interlayer insulating layer 32, which is located over the storage electrodes 24, is removed to reduce the global step difference between the cell array area and the peripheral circuit area. This process is well known in the industry as a cell open process. As a result of the cell open process, a protrusion 34 of the third interlayer insulating layer 32 remains. Preferably, the altitude level of the top surface of the third interlayer insulating layer 32 in the cell array area is adjusted by the cell open process to be substantially the same as that in the peripheral area, thereby substantially removing the global step difference.

Referring to FIG. 1c, the third interlayer insulating layer 32 is subject to a CMP (chemical mechanical polishing) process to remove the protrusion 34 and make the whole surface of the third interlayer insulating layer 32 more perfectly planarized, thereby leaving a planarized interlayer insulating layer 32a.

Though not shown in the drawings, on the planarized interlayer insulating layer 32a, a multilevel metal interconnection including an intermetal insulating layer is formed. A passivation layer (though not shown) is formed on the multilevel metal interconnection. Subsequently, the passivation layer, the intermetal insulating layer, the planarized interlayer insulating layer 32a, the plate electrode 28 and the second interlayer insulating layer 22 are selectively etched to form a fuse opening on the fuse 20, though not shown in the drawings. The reference number '35' represents a portion of the planarized interlayer insulating layer 32a, which is to be removed to form the fuse opening.

One problem in the above-described method for forming the fuse opening is that the thickness of the planarized interlayer insulating layer 32a is too thick in the peripheral circuit area as a result of the process for reducing the global step difference and removing the protrusion 34. Therefore, the depth of the portion 35 of the planarized insulating layer 32a to be etched is too large, resulting in an unfavorably long etching time. The large etching amount and the long etching time may result in low productivity.

Accordingly, the need remains for a method for forming DRAM devices to reduce the etching amount and time for forming a fuse opening, while at the same time significantly reducing the substantial global step difference between a cell array area and a peripheral circuit area.

SUMMARY OF THE INVENTION

It is an object of the present invention to provide a method for forming a semiconductor device with high productivity.

It is another object of the present invention to provide a method for forming a semiconductor device having a fuse, wherein the etching amount for forming a fuse opening is low.

It is another object of the present invention to provide a method for forming a semiconductor device having a fuse, wherein the etching time for forming a fuse opening is low, and wherein the global step difference between a cell array area and a peripheral circuit area is significantly reduced.

According to one aspect of the present invention, a method of fabricating a semiconductor device is provided. The method comprises providing a substrate including a first area, a second area and a global step difference between the first and the second areas. The substrate comprises a fuse formed in the second area of the substrate. An interlayer insulating layer is formed on the substrate. A first portion of the interlayer insulating layer in the first area and a second portion of the interlayer insulating layer in the second area are removed simultaneously, thereby decreasing the global step difference and defining a first recess in the interlayer insulating layer in the second area. The first recess is defined over the fuse. The interlayer insulating layer is planarized after defining the first recess. A metal pattern is formed on the interlayer insulating layer. An intermetal insulating layer is formed on the metal pattern. A first portion of the intermetal insulating layer is removed to expose a portion of the metal pattern, thereby forming a via hole through the intermetal insulating layer. Simultaneously, a second portion of the intermetal insulating layer in the second area and a third portion of the interlayer insulating layer in the second area are removed, thereby defining a second recess in a composite layer of the interlayer insulating layer and the intermetal insulating layer in the second area. The second recess is defined over the fuse. A passivation layer is formed on the interlayer insulating layer. A fuse opening is formed on the fuse. The fuse opening is formed through the passivation layer, the interlayer insulating layer, the first recess and the second recess. The first area is a cell array area and the second area is a peripheral circuit area. The width of the first recess is greater than that of the fuse opening. The width of the second recess is greater than that of the fuse opening. The width of the first recess is greater than that of the second recess.

According to another aspect of the present invention, a method of fabricating a semiconductor device is provided. The method comprises providing a substrate including a first area, a second area and a global step difference between the first area and the second area. The substrate comprises a fuse formed in the second area and a conductive layer. The conductive layer is formed in the first and second areas. The conductive layer is formed over the fuse. An interlayer insulating layer is formed on the substrate. A fourth portion of the interlayer insulating layer is removed to form a contact hole. A fifth portion of the interlayer insulating layer is removed to define a first recess in the interlayer insulating layer in the second area. The fourth and fifth portions of the interlayer insulating layer are removed simultaneously. The contact hole exposes a first portion of the conductive layer. The first recess exposes a second portion of the conductive layer in the second area. The first portion of the conductive layer is in the second area. The first recess is defined over the fuse. A conductive plug is formed in the contact hole. A metal pattern is formed on the interlayer. insulating layer. The metal pattern is electrically connected to the conductive plug. An intermetal insulating layer is formed on the metal pattern. A first portion of the intermetal insulating layer is removed to expose a portion of the metal pattern, thereby forming a via hole through the intermetal insulating layer. Simultaneously, a second portion of the intermetal insulating layer in the second area is removed, thereby defining a second recess in the intermetal insulating layer in the second area. The second recess is defined over the fuse and exposes a third portion of the conductive layer. A passivation layer is formed on the interlayer insulating layer. A fuse opening is formed on the fuse. The fuse opening is formed through the passivation layer, the conductive layer and the first recess. The second recess is defined within the first recess. The width of the first recess is greater than that of the fuse opening. The width of the second recess is greater than that of the fuse opening. The width of the first recess is greater than that of the second recess.

According to another aspect of the present invention, a method of fabricating a semiconductor device is provided. The method comprises providing a substrate including a first area, a second area and a global step difference between the first area and the second area. The substrate comprises a fuse formed in the second area. An interlayer insulating layer is formed on the substrate. A metal pattern is formed on the interlayer insulating layer. An intermetal insulating layer is formed on the metal pattern. A first portion of the intermetal insulating layer is removed to expose a portion of the metal pattern, thereby forming a via hole through the intermetal insulating layer. Simultaneously, a second portion of the intermetal insulating layer in the second area removed to define a recess. The recess is defined over the fuse. A passivation layer is formed on the interlayer insulating layer. A fuse opening is formed on the fuse. The fuse opening is formed through the passivation layer and the recess. The width of the recess is greater than that of the fuse opening. During the simultaneous removal, a portion of the interlayer insulating layer may be further removed, thereby extending the recess into the interlayer insulating layer in the second area.

BRIEF DESCRIPTION OF THE DRAWINGS

Other features of the present invention will be more readily understood from the following detailed description of specific embodiments thereof when read in conjunction with the accompanying drawings, in which:

FIGS. 1a through 1c are cross-sectional views illustrating successive process steps for forming a fuse opening according to a conventional method;

FIGS. 2a through 2f are cross-sectional views illustrating successive process steps for forming a fuse opening according to a first embodiment of the present invention;

FIGS. 3a through 3c are cross-sectional views illustrating successive process steps for forming a fuse opening according to a second embodiment of the present invention;

FIGS. 4a through 4d are cross-sectional views illustrating successive process steps for forming a fuse opening according to a third embodiment of the present invention.

DESCRIPTION OF THE PREFERRED EMBODIMENT

Figure 1A:
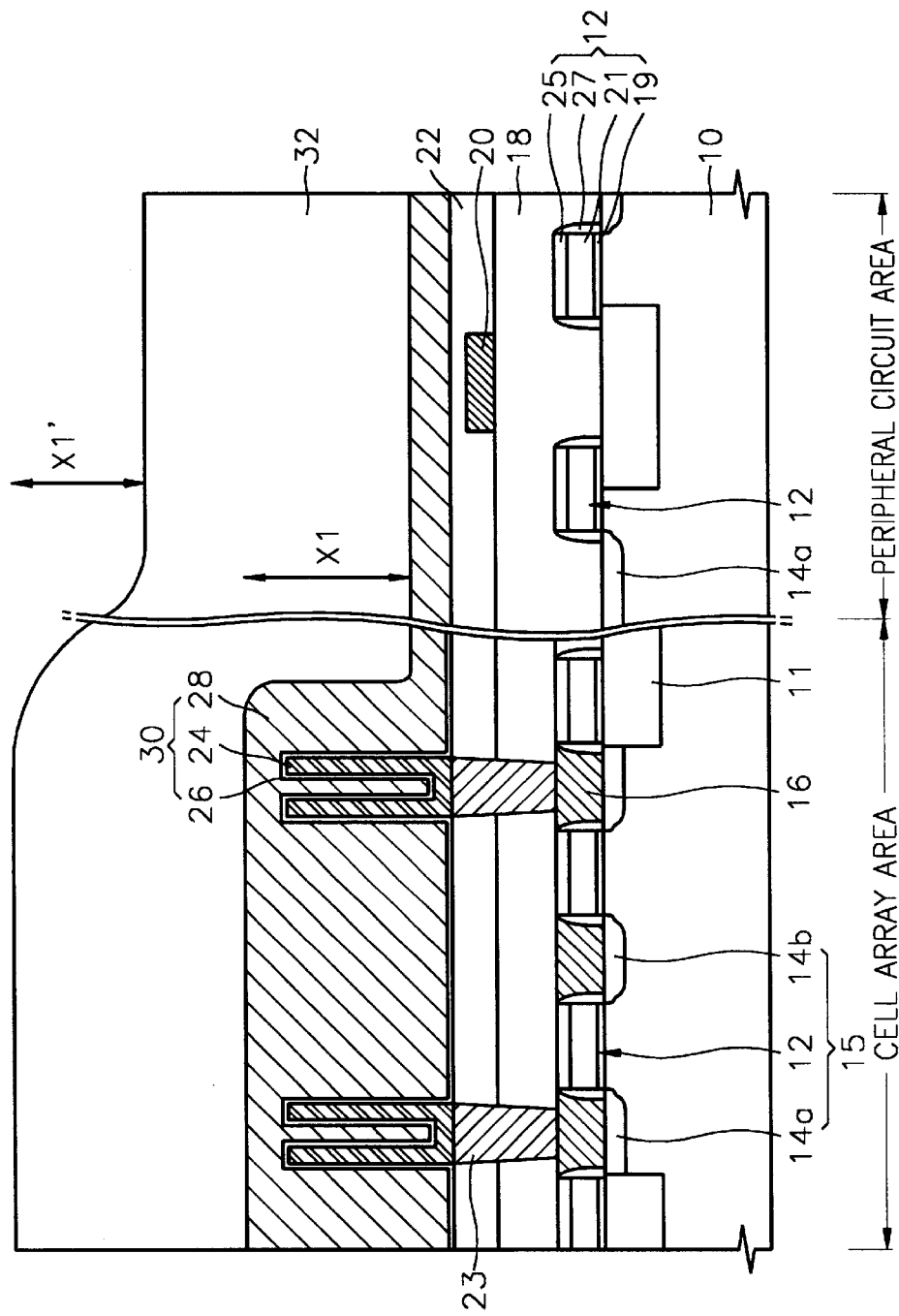
Figure 1C:
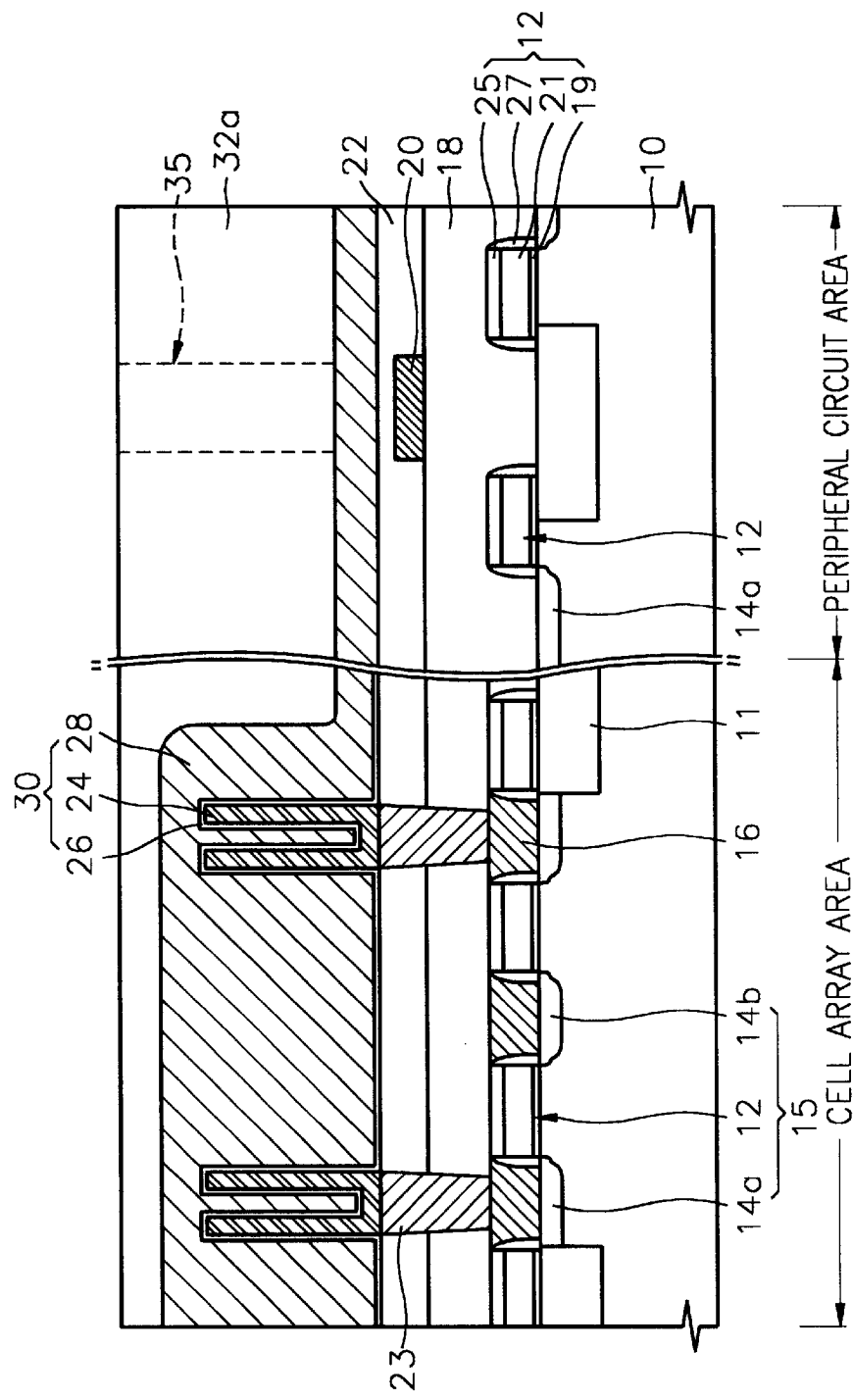

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the geometrical magnitude of elements may be exaggerated for clarity. In the discussion and claims herein, it will also be understood that when a layer is referred to as being "on" another layer or a substrate, it can be directly on the other layer or the substrate, or intervening layers may also be present.

First Embodiment

Figure 2A:
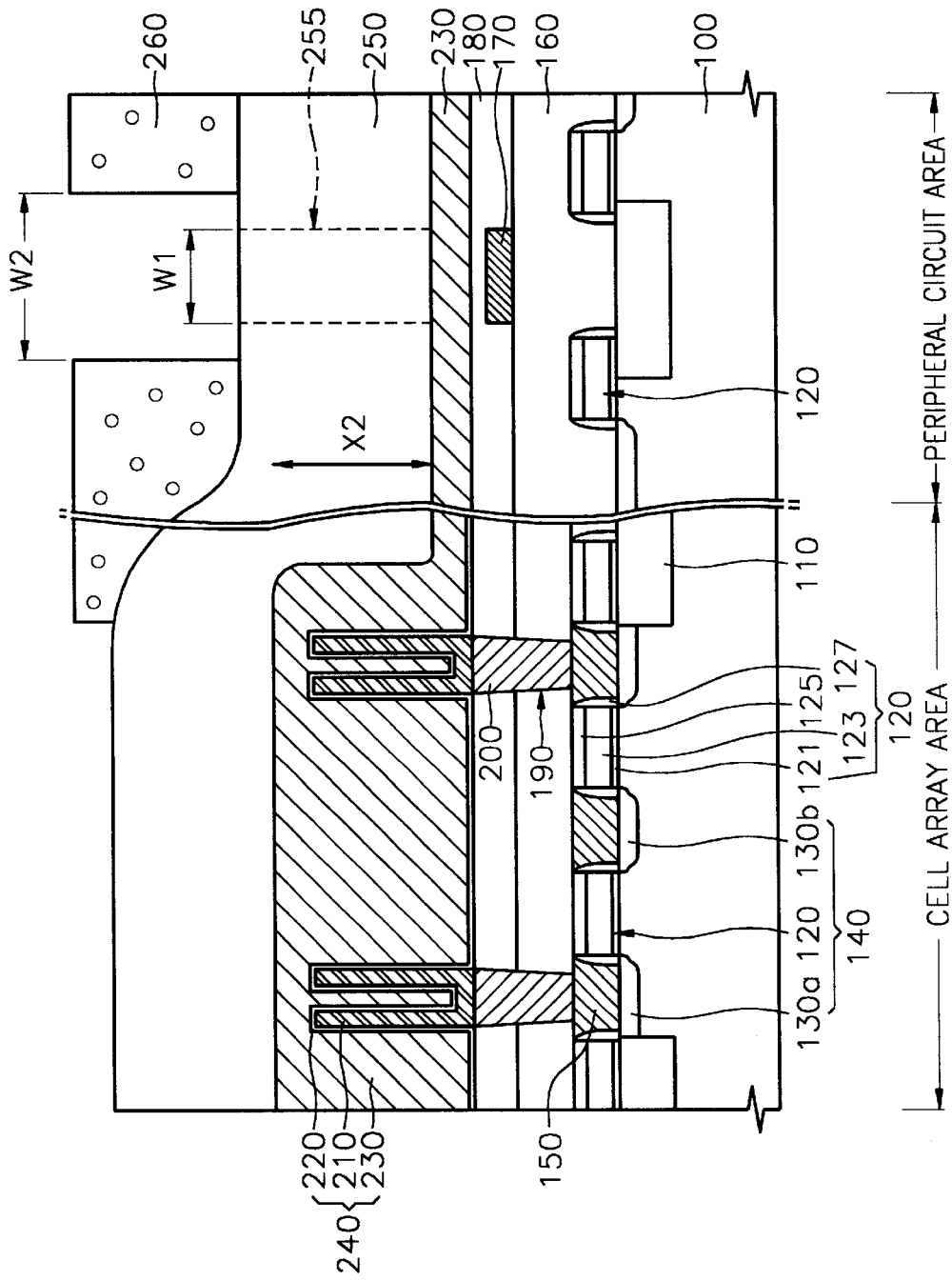

FIGS. 2a through 2f are cross-sectional views illustrating successive process steps for forming a fuse opening according to a first embodiment of the present invention. Referring to FIG. 2a, isolation regions 110 are formed on a semiconductor wafer 100, thereby defining active regions. For Example, the isolation regions 110 are formed by an STI (shallow trench isolation) technique.

MOS transistors 140 are formed on the semiconductor wafer 100 having the isolation regions 110. Each of the MOS transistors 140 comprises a gate electrode 120 and a pair of impurity doped regions. The impurity doped regions, i.e. a source 130a and a drain 130b, are formed in the active region of the semiconductor wafer 100. The MOS transistors 140 in a cell array area are formed more densely than the MOS transistors 140 in a peripheral circuit area. The gate electrodes 120 comprise a gate dielectric layer 121, a gate conductive layer 123, a hard mask layer 125 and spacers 127. In detail, the gate dielectric layer 121, the gate conductive layer 123 and a hard mask layer 125 are deposited on the active regions of the semiconductor wafer 100 and then patterned. Spacers 127 are formed on the sidewalls of the gate conductive layers 123. The impurity doped regions are formed by an ion implantation of impurities, which are opposite type to impurities of the wafer 100. Between the gate electrodes 120, SAC (self-aligned contact) pads 150 are formed to contact the sources 130a and the drains 130b. The SAC pads 150 are electrically isolated from the gate conductive layer 123 by the hard mask layer 125 and the spacers 127. The SAC pads 150 are formed only in the dense cell array area.

On the resultant structure, a first interlayer insulating layer 160 is formed. Bit line contact holes are formed through the first interlayer insulating layer 160. On the first interlayer insulating layer 160, bit lines (though not shown) and fuse 170 are formed in the cell array area and in the peripheral circuit area, respectively. Through the bit line contact holes, the bit lines are electrically connected to a portion of the SAC pads 150, which are formed on the drains 130b. Though not shown, during formation of the bit line and fuse 170, a local interconnection may be formed simultaneously on the first interlayer insulating layer 160 in the peripheral circuit area. A portion of the local interconnection may be electrically connected to the MOS transistors 140 in a peripheral circuit area.

A second interlayer insulating layer 180 is formed on the resultant structure. Subsequently, storage contact holes 190 are formed through the first and second interlayer insulating layers 160, 180. The storage contact holes 190 expose the other portion of the SAC pads 150, which are formed on the sources 130a. Conductive storage contact pads 200 are formed to fill the storage contact holes 190.

On the resultant structure, storage capacitors 240 are formed. Each of the storage capacitors 240 comprises a concave type storage electrode 210, a capacitor dielectric layer 220 formed on the storage electrode 210 and a plate electrode 230 formed on the capacitor dielectric layer 220. The concave type storage electrodes 210 are formed to electrically contact the storage contact pads 200. The storage electrodes 210 are formed only in the cell array area. It is well known in the art that the height of the storage electrodes 210 required to be 1 $\mu$m or more in order to maintain a cell capacitance of 25pF or more. The plate electrode 230 is formed in the cell array area and the peripheral circuit area. As a result, as shown in the drawing, a global step difference X2 is generated. Though not shown, the plate electrode 230 may be formed only in the cell array area.

A third interlayer insulating layer 250 is formed on the plate electrode 230. The third interlayer insulating layer 250 is thick enough to bury the global step difference X2. That is to say, the thickness of the third interlayer insulating layer 250 is greater than the global step difference X2. The thickness of the third interlayer insulating layer 250 is preferably 1.5~4.5 $\mu$m. The third interlayer insulating layer 250 may be formed by a method to make the top surface of the resultant structure planarized to some extent. However, it is very difficult to make the top surface of the third interlayer insulating layer 250 completely planarized. The third interlayer insulating layer 250 is preferably formed of PETEOS (plasma enhanced tetraethylorthosilicate).

A first photoresist pattern 260 is formed on the resultant structure to expose a first and a second portion of the third interlayer insulating layer 250 in the cell array area and in the peripheral circuit area, respectively. The first portion of the third interlayer insulating layer 250 is located over the storage electrodes 210 in the cell array area. The second portion of the third interlayer insulating layer 250 is located over the fuse 170. The reference number '255' represents a selected portion of the third interlayer insulating layer 250, which is to be removed in the subsequent process steps to form a fuse opening. The reference symbol 'W2' represents the width of the second portion of the third interlayer insulating layer 250. As described in the drawing, the width W2 is greater than the width W1 of the selected portion of the third interlayer insulating layer 250 which is to be removed to form the fuse opening.

Referring to FIG. 2b, the first portion of the third interlayer insulating layer 250, i.e., a top portion of the third interlayer insulating layer 250 over the storage electrodes 210, is removed to reduce the global step difference between the cell array area and the peripheral circuit area. Preferably, the altitude level of the top surface of the third interlayer insulating layer 250 in the cell array area is adjusted to be substantially the same as that in the peripheral area. The second portion of the third interlayer insulating layer 250, which is located over the fuse 170, is also removed, thereby defining a first recess 270 in the third interlayer insulating layer 250 in the peripheral area. The first recess 270 is defined over the fuse 170 such that the bottom surface of the first recess 270 is below the top surface of the plate electrode 230 formed in the cell array area. The first and second portions of the third interlayer insulating layer 250 are simultaneously removed by using the first photoresist pattern 260 as an etching mask. The etching amount for forming the first recess 270 is approximately 1.5~3 µm. As a result of the simultaneous removal, a protrusion 257 of the third interlayer insulating layer 250 remains. Subsequently, the first photoresist pattern 260 is removed.

Figure 2C:
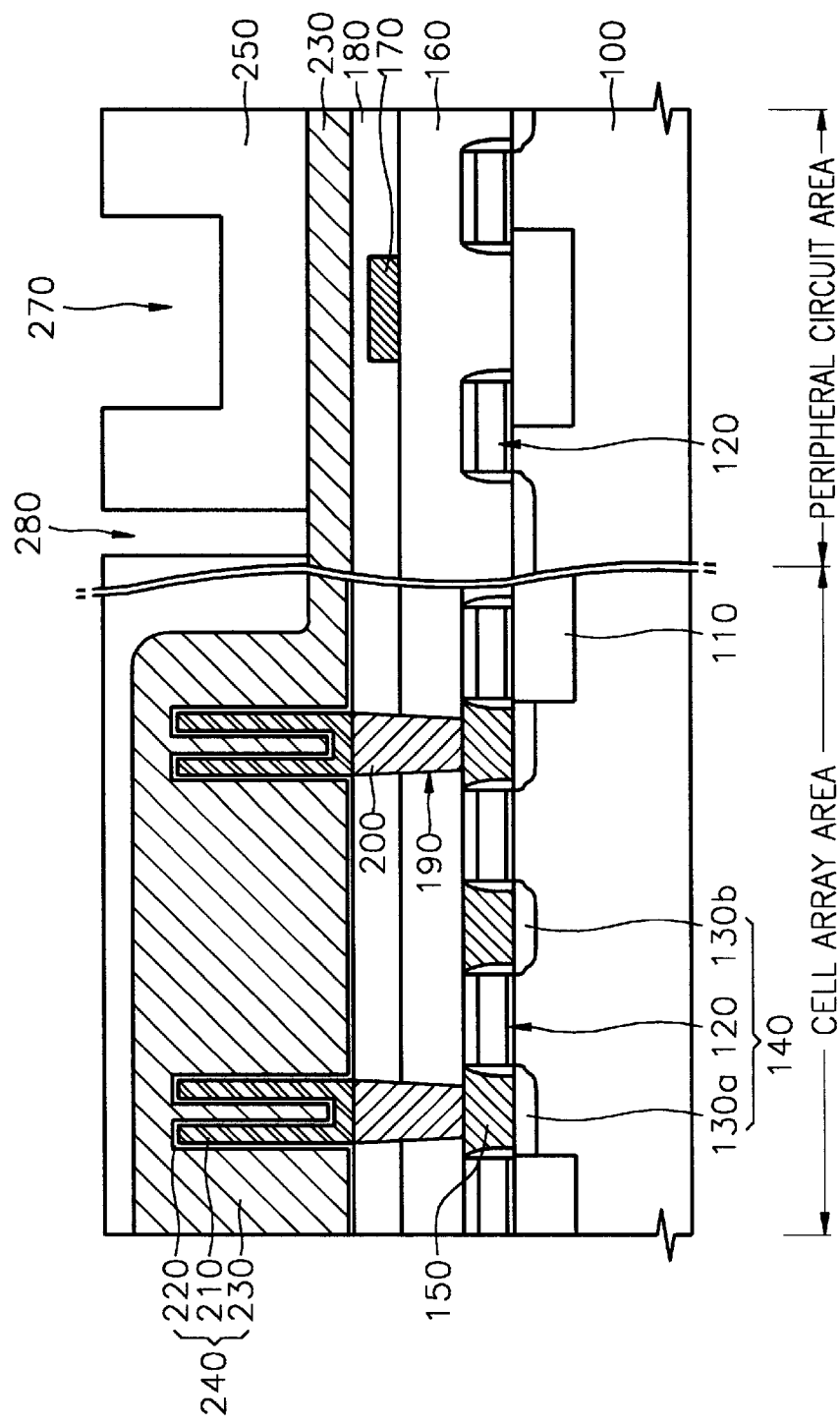

Referring to FIG. 2c, the third interlayer insulating layer 250 is subject to a CMP (chemical mechanical polishing) process, thereby removing the protrusion 257 and planarizing the whole surface of the third interlayer insulating layer 250 more perfectly. Subsequently, the third interlayer insulating layer 250 is etched to form a contact hole 280. The contact hole 280 is formed though the third interlayer insulating layer 250, thereby exposing a first portion of a conductive layer. The conductive layer preferably is the plate electrode 230 or the bit lines. In this embodiment, the conductive layer is the plate electrode 230.

Figure 2D:
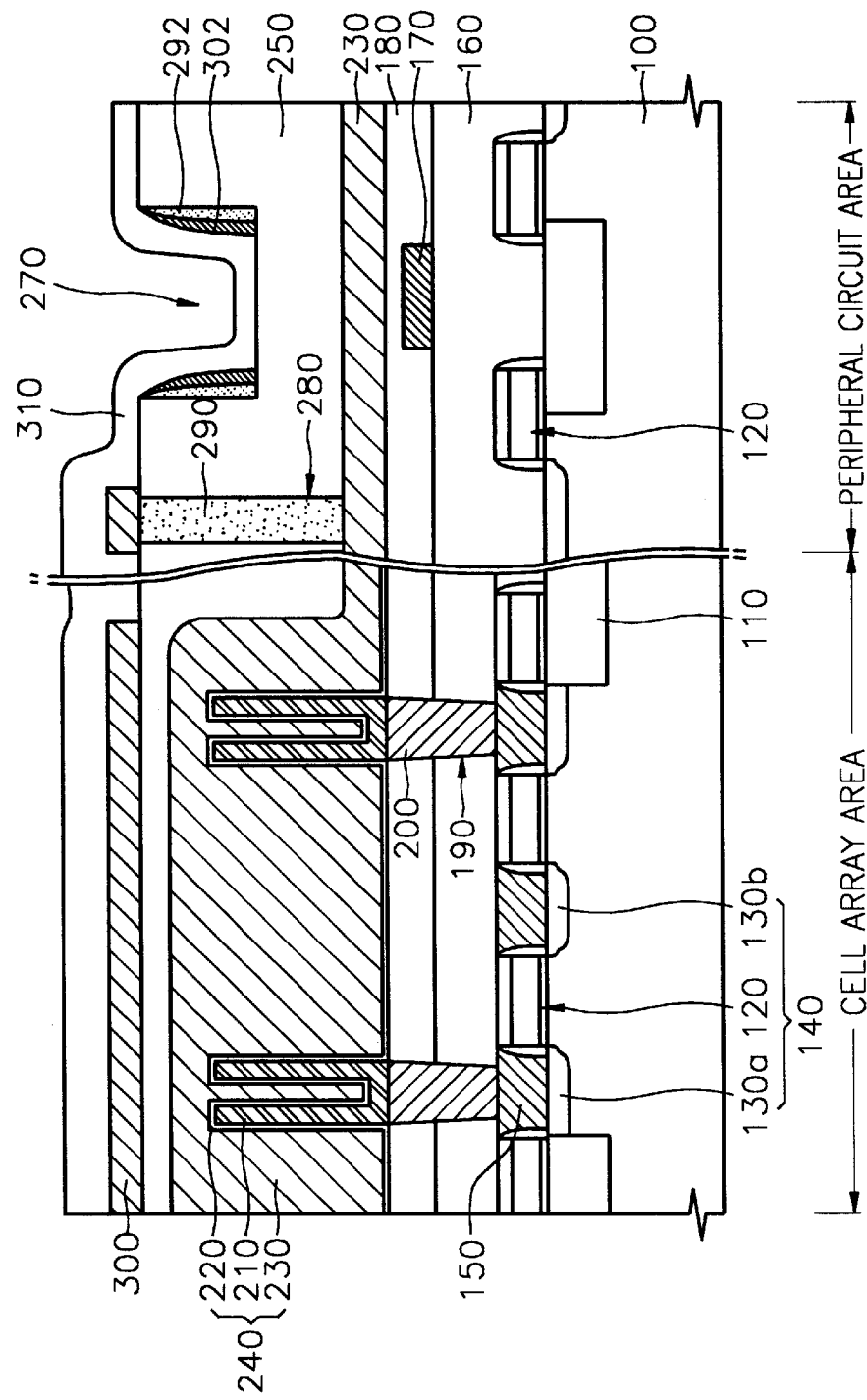

Referring to FIG. 2d, a plug metal layer (though not shown) is formed on the resultant structure. The plug metal layer completely fills the contact hole 280. Subsequently, the plug metal layer is subjected to an anisotropic etchback to form a first conductive plug 290 in the contact hole 280. As a result of the etchback, a first residue 292 of the plug metal layer may remain in the shape of a spacer on the sidewall of the first recess 270. A first metal pattern 300 is formed on the third interlayer insulating layer 250 and is electrically connected to the first conductive plug 290. During the formation of the first metal pattern 300, a second residue 302 of the material of the first metal pattern may remain in the shape of a spacer on the sidewall of the first recess 270. An intermetal insulating layer 310 is formed on the resultant structure. The intermetal insulating layer 310 is preferably a PE-TEOS layer, a SOG layer, or a composite layer thereof.

Figure 2E:
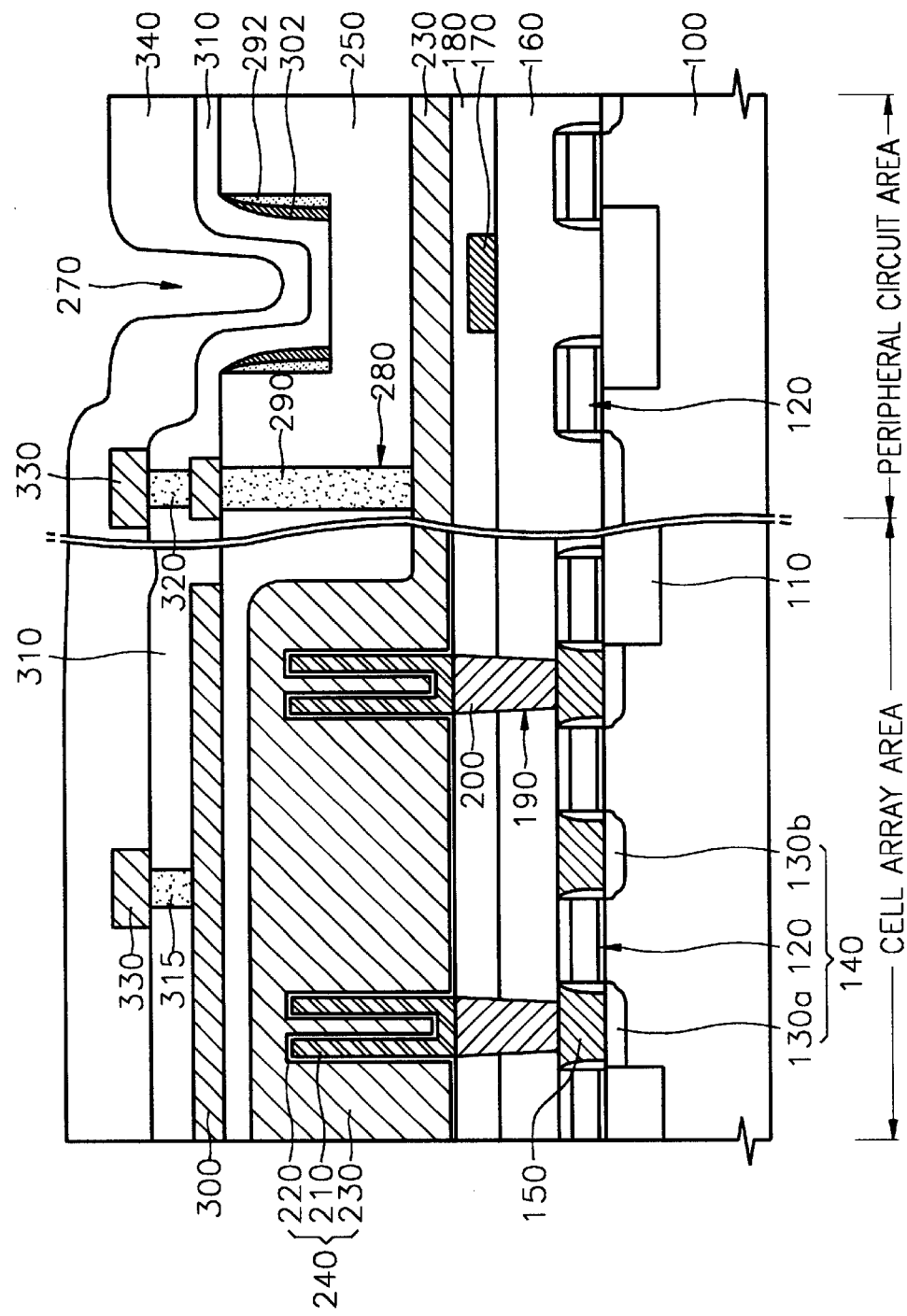

Referring to FIG. 2e, via holes 315 are formed by etching a first portion of the intermetal insulating layer 310, thereby exposing a portion of the first metal pattern 300. Because the size of the via holes 315 is usually very small, the etching for forming the via holes 315 may be performed overly. As a result of the over etching, a second portion of the intermetal insulating layer 310, which is located in the first recess 270, may be partially removed (not shown in the drawings). Subsequently, second conductive plugs 320 are formed in the via holes 315. A second metal pattern 330 is formed on the intermetal insulating layer 310 and is electrically connected to a portion of the second conductive plugs 320. On the resultant structure, a passivation layer 340 is formed. The passivation layer 340 is preferably a composite layer of a HDP (high density plasma) oxide and a plasma silicon nitride. For example, the thickness of the HDP oxide is 0.5~1.5 um and the thickness of the plasma silicon nitride oxide is 0.4~0.8 um.

Figure 2F:
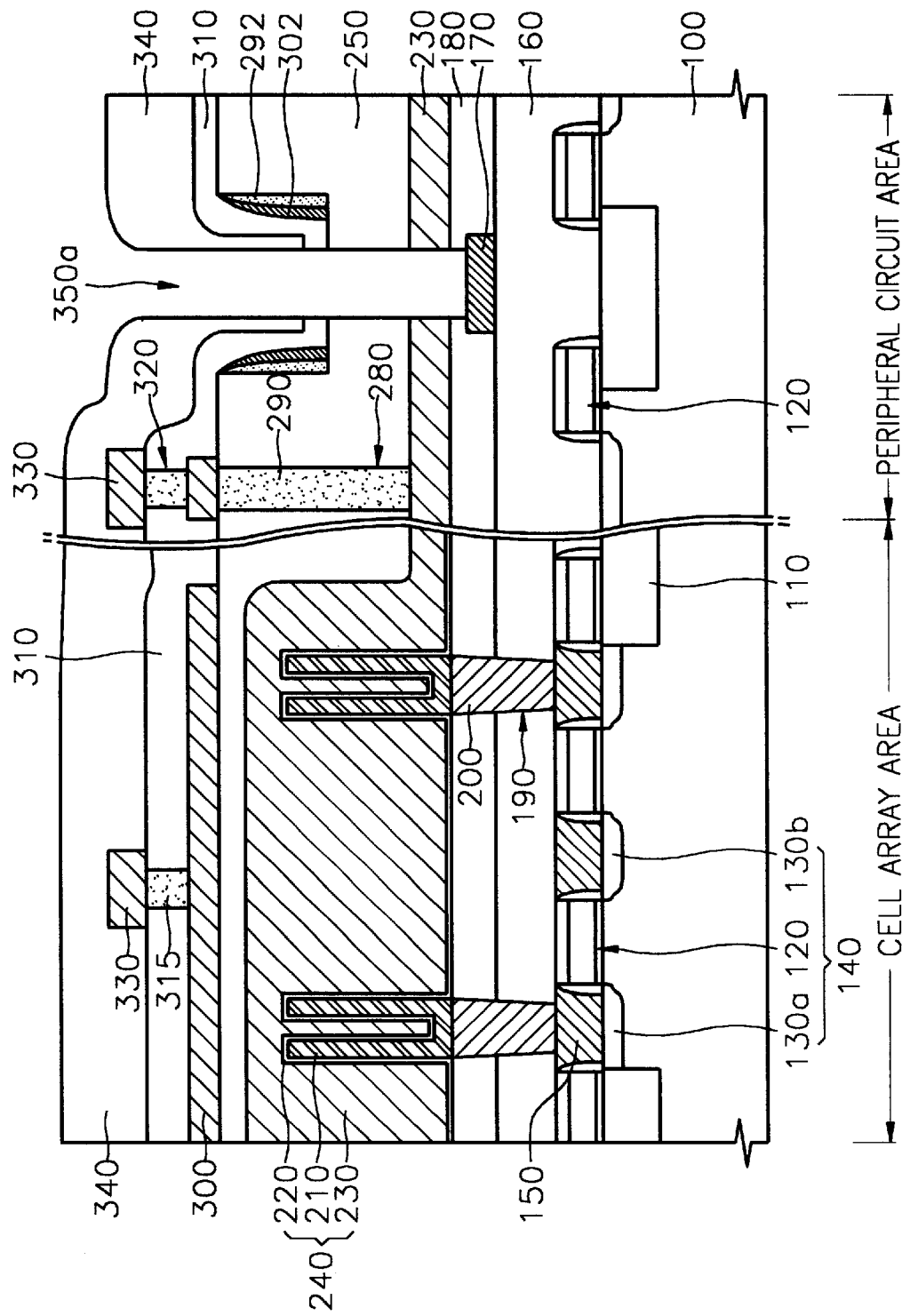

Referring to FIG. 2f, a fuse opening 350a is formed through the passivation layer 340, the intermetal insulating layer 310, the third interlayer insulating layer 250 and the plate electrode 230. In detail, the passivation layer 340, the intermetal insulating layer 310 and the third interlayer insulating layer 250 are etched by using the plate electrode 230 as an etch stopper, thereby exposing the plate electrode 230. Subsequently, the plate electrode 230 and the second interlayer insulating layers 180 are etched to expose the fuse 170. The width of the first recess 270 is greater than that of the fuse opening 350a, which is formed through the first recess 270.

According to the first embodiment of the invention, the second portion of the third interlayer insulating layer 250 is removed to define the first recess 270 in the peripheral area. Accordingly, the amount of the third interlayer insulating layer 250 to be etched for forming the fuse opening is relatively small compared to that of the conventional method. For example, the amount of the insulating layers to be etched for forming the fuse opening is approximately 4 um, while that of the first embodiment of the invention is approximately 2.6 um. The decreased etching amount results in decreased etching time and higher productivity.

Meanwhile, as described above, the first and second residues 292, 302 may remain in the shape of a spacer on the sidewall of the first recess 270. However, the first and second residue 292, 302 induce substantially no problem, because they are isolated from the other electrically conductive elements by the intermetal insulating layer 310 and the third interlayer insulating layer 250. That is to say, the first and second residues 292, 302 are electrically floated.

Second Embodiment

Figure 3B:
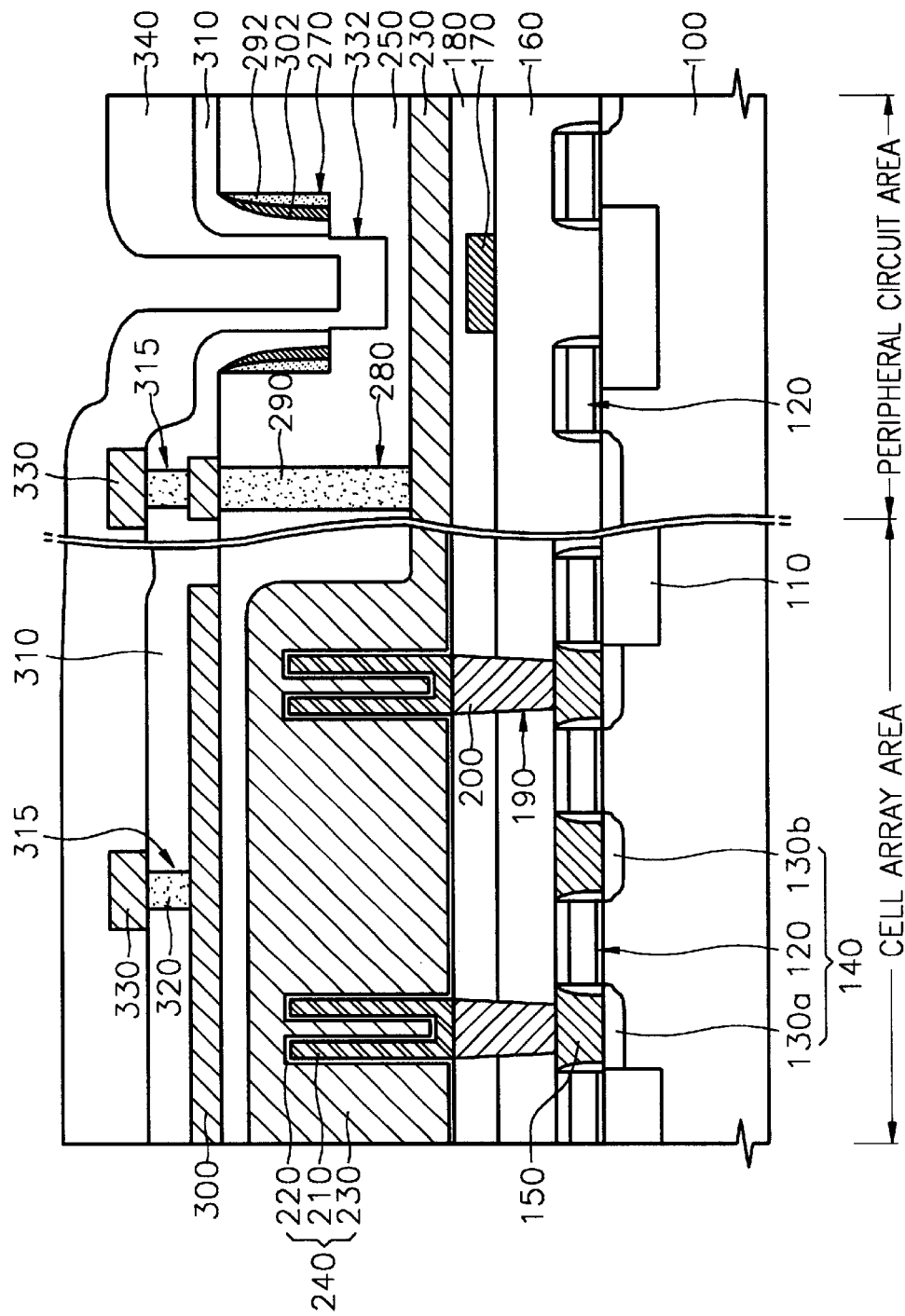
Figure 3C:
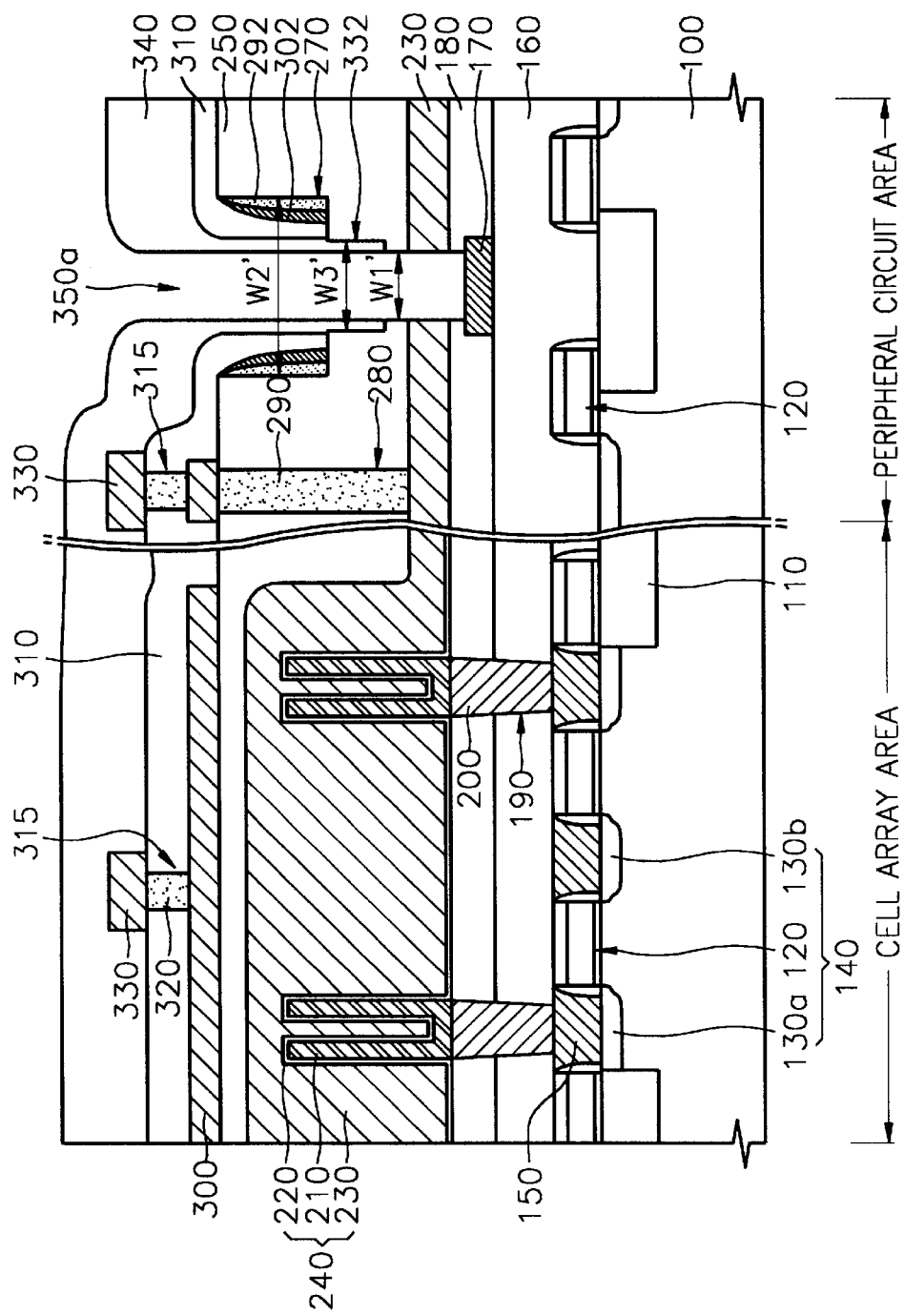

FIGS. 3a through 3c are cross-sectional views illustrating successive process steps for forming a fuse opening according to a second embodiment of the present invention. The second embodiment includes the same manufacturing process steps as those of FIGS. 2a through 2d of the first embodiment. Therefore, the second embodiment will be described from the process steps just after FIG. 2d. That is to say, the process steps of FIGS. 3a through 3c are performed subsequently to those of FIGS. 2a through 2d. The same elements as those of the first embodiment are denoted by like reference numerals.

Referring to FIG. 3a, a second photoresist pattern 312 is formed on the intermetal insulating layer 310. The second photoresist pattern 312 exposes a first portion of the intermetal insulating layer 310 and a second. portion of the intermetal insulating layer 310. The first portion of the intermetal insulating layer 310 is located on the first metal pattern 300. The second portion of the intermetal insulating layer 310 is located in the first recess 270.

Referring to FIG. 3b, the first portion of the intermetal insulating layer 310 is removed by using the second photoresist pattern 312 as an etch mask, thereby forming a via holes 315 through the intermetal insulating layer 310 and exposing a portion of the first metal pattern 300. Simultaneously, the second portion of the intermetal insulating layer 310 and a third portion of the third interlayer insulating layer 250 are removed by using the second photoresist pattern 312 as an etch mask, thereby defining a second recess 332 in a composite layer of the third interlayer insulating layer 250 and the intermetal insulating layer 310 in the peripheral circuit area. The bottom of the second recess 332 is formed below the top level of the plate electrode 230 in the cell array area. The second recess 332 is defined over the fuse 170 and through the floor of the first recess 270. The second recess 332 does not expose the plate electrode 230 so that 2000~3000 Å of the third interlayer insulating layer 250 remains on the plate electrode 230.

Subsequently, second photoresist pattern 312 is removed, and then second conductive plugs 320 are formed in the via holes 315. A second metal pattern 330 is formed on the intermetal insulating layer 310 and is electrically connected to a portion of the second conductive plugs 320. On the resultant structure, a passivation layer 340 is formed by the same method as that of the first embodiment.

Referring to FIG. 3c, a fuse opening 350a is formed through the passivation layer 340, the third interlayer insulating layer 250 and the plate electrode 230. In detail, the passivation layer 340 and the third interlayer insulating layer 250 are etched by using the plate electrode 230 as an etch stopper, thereby exposing the plate electrode 230. Subsequently, the plate electrode 230 and the second interlayer insulating layers 180 are etched to expose the fuse 170. The fuse opening 350a is formed through the first and second recesses 270, 332. In the second embodiment of the present invention, the width W3' of the second recess 332 is greater than the width W1' of the fuse opening 350a and less than the width W2' of the first recess 270.

According to the second embodiment of the invention, the second portion of the third interlayer insulating layer 250 is removed to define the first recess 270 in the peripheral area. In addition, the second portion of the intermetal insulating layer 310 and the third portion of the third interlayer insulating layer 250 are also removed to define the second recess 332 in the peripheral area during the formation process of the via holes 315. Accordingly, the amount of the insulating layers to be etched for forming the fuse opening 350a is relatively small compared to those of the conventional method and the first embodiment.

Third Embodiment

FIGS. 4a through 4d are cross-sectional views illustrating successive process steps for forming a fuse opening according to a third embodiment of the present invention. The third embodiment includes the same manufacturing process steps as those of the first embodiment until after the formation of the third interlayer insulating layer 250, except that the plate electrode 230 is preferably thicker than those of the first and second embodiments. Therefore, the manufacturing process steps hereinafter are performed subsequently to the formation of the third interlayer insulating layer 250 of the first embodiment. The same elements as those of the first embodiment are denoted by like reference numerals.

Figure 4A:
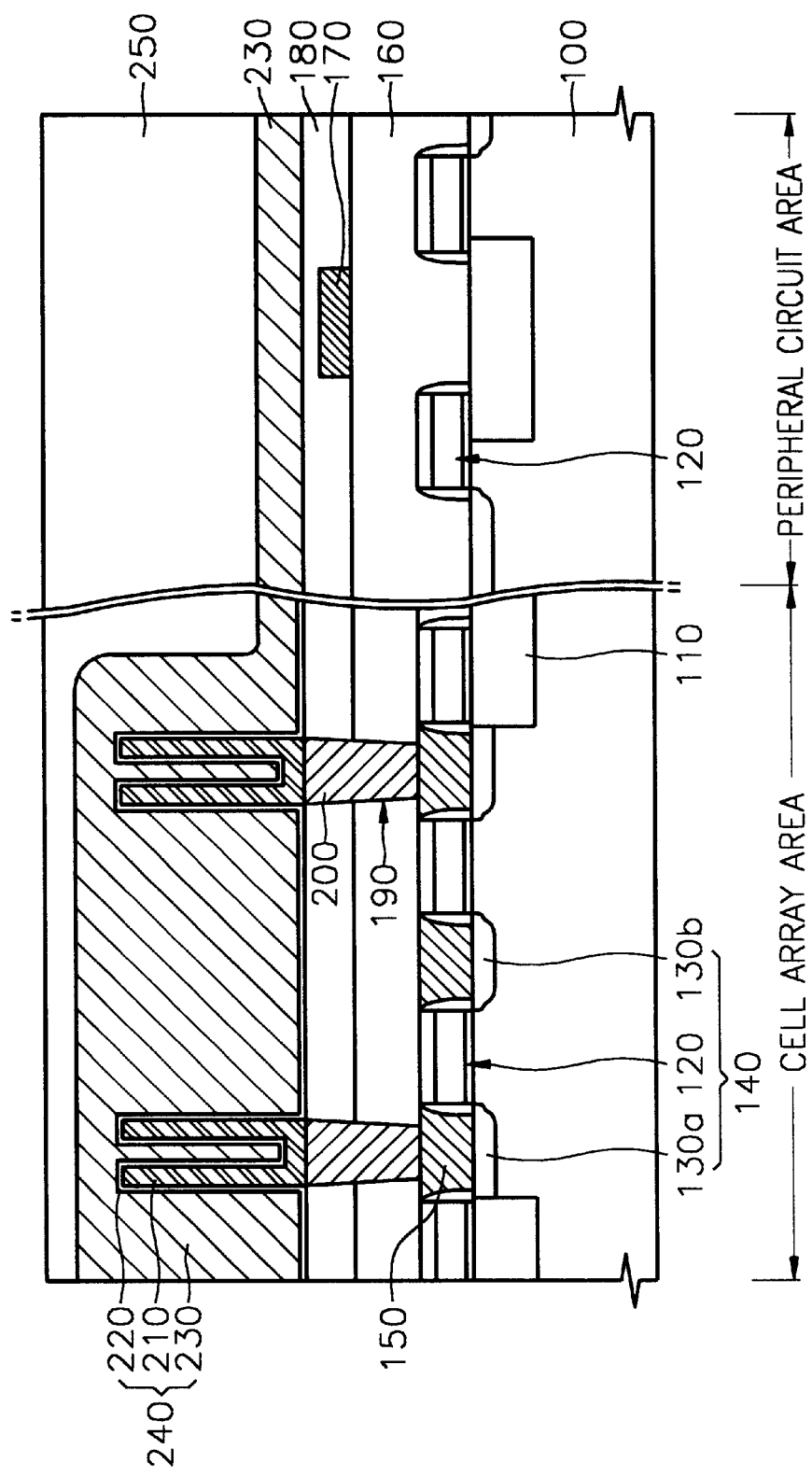

Referring to FIG. 4a, the cell open process is performed, as described in the background of the invention. That is to say, a first photoresist pattern (though not shown) is formed on the resultant structure to expose a first portion of the third interlayer insulating layer 250 in the cell array area. The first portion of the third interlayer insulating layer 250 is located over the storage electrodes 210 in the cell array area. The first portion of the third interlayer insulating layer 250, i.e., a top portion of the third interlayer insulating layer 250 over the storage electrode 210, is removed by using the first photoresist pattern as an etching mask, thereby reducing the global step difference between the cell array area and the peripheral circuit area. Preferably, the altitude level of the top surface of the third interlayer insulating layer 250 in the cell array area is adjusted to be substantially same as that in the peripheral area. As a result of the cell open process, a protrusion (though not shown) of the third interlayer insulating layer 250 remains. Being different from the first and second embodiments, the second portion of the third interlayer insulating layer 250, which is located over the fuse 170, is not removed during the cell open process. Subsequently, the first photoresist pattern is removed, and then the third interlayer insulating layer 250 is subject to a CMP (chemical mechanical polishing) process, thereby removing the protrusion and planarizing the whole surface of the third interlayer insulating layer 250 more perfectly.

Figure 4B:
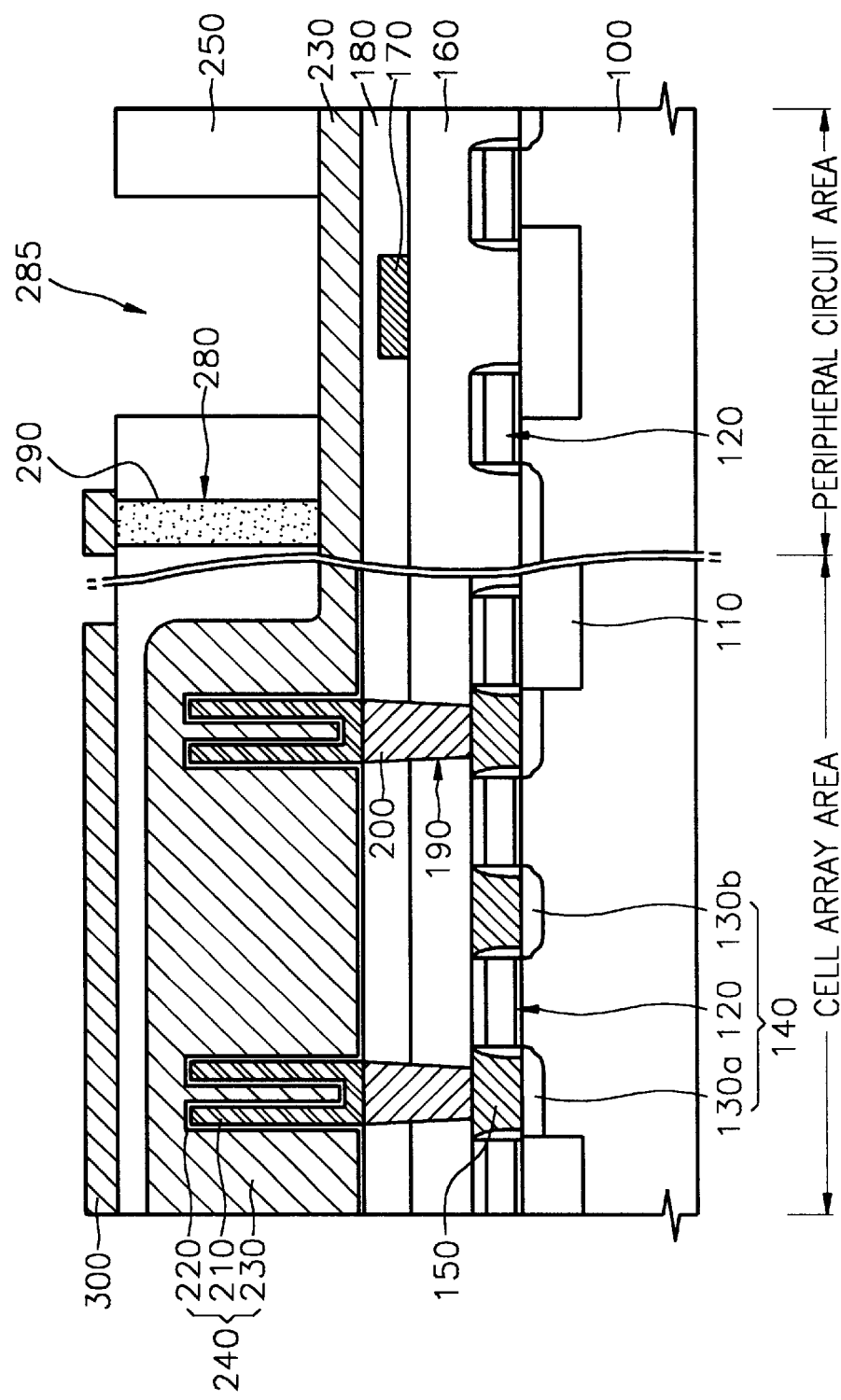

Referring to FIG. 4b, a fourth portion of the third interlayer insulating layer 250 is removed by etching, thereby forming a contact hole 280 though the third interlayer insulating layer 250. The contact hole 280 exposes a first portion of a conductive layer. A fifth portion of the third interlayer insulating layer 250, which is located over the fuse 170, is also removed by etching, thereby defining a first recess 285 though the third interlayer insulating layer 250 in the peripheral area. The removing of the fourth and fifth portions of the third interlayer insulating layer 250 is preformed simultaneously. The first recess 285 exposes a second portion of a conductive layer. The second portion of conductive layer may be the plate electrode 230 or the bit lines formed on the peripheral area. In this embodiment, the conductive layer is the plate electrode 230. The first recess 285 is defined over the fuse 170. During the etching for forming the contact hole 280 and the first recess 285, unfavorable excessive etching damage may be induced on the plate electrode 230 so that the plate electrode 230 is partially removed under the first recess 285. However, because the plate electrode 230 is preferably thicker than those of the first and second embodiments, the partial removal problem can be substantially prevented.

A plug metal layer (though not shown) is formed on the resultant structure. The plug metal layer completely. fills the contact hole 280. Subsequently, the plug metal layer is subjected to an anisotropic etchback to form a first conductive plug 290 in the contact hole 280. The etchback is performed under a low RF power to prevent generation of a residue of the plug metal layer, which possibly remains on the sidewall and bottom of the first recess 285. The possible residue may also be prevented by using a down steam type etchback. A first metal pattern 300 is formed on the third interlayer insulating layer 250 to be electrically connected to the first conductive plug 290.

Figure 4C:
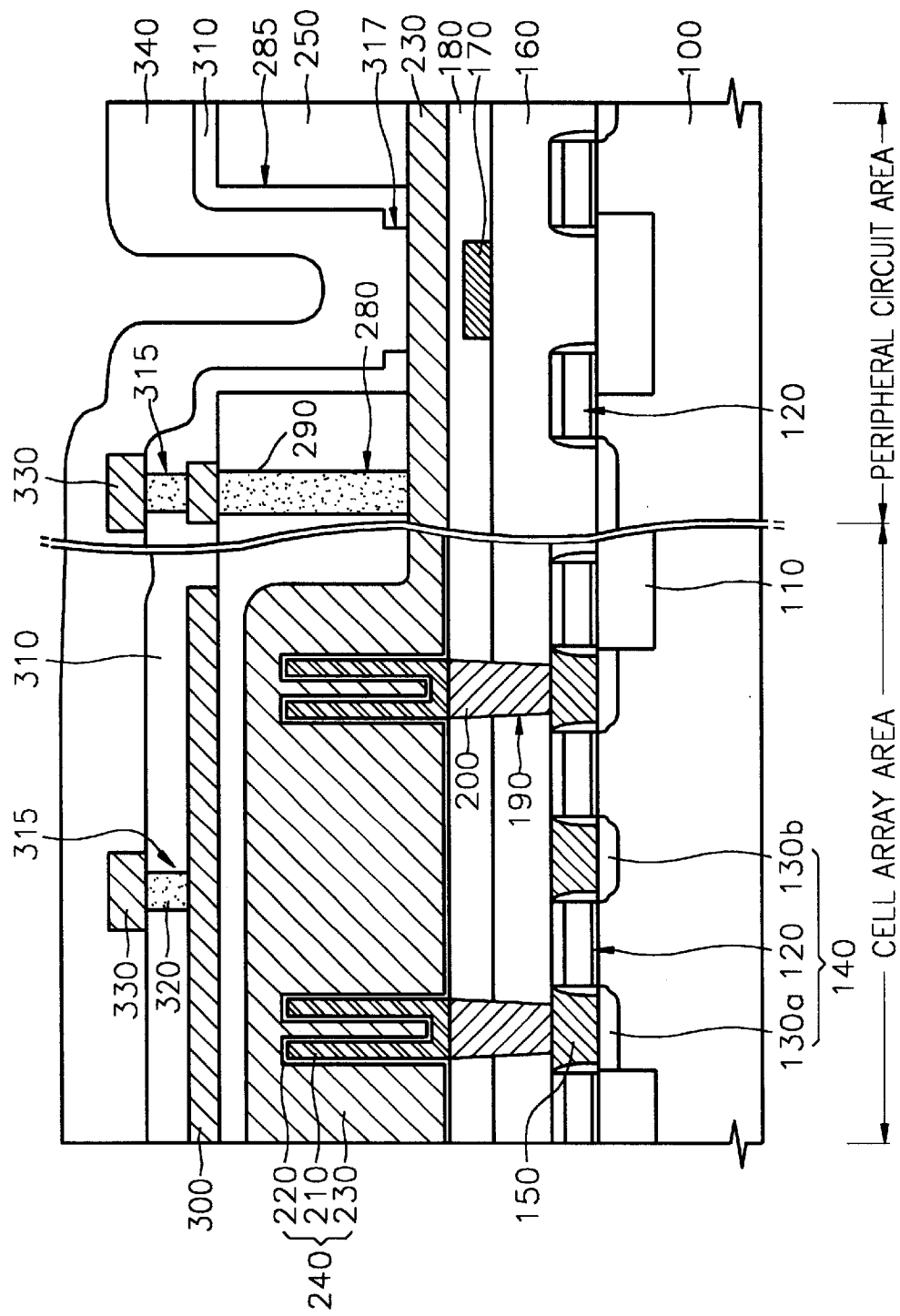

Referring to FIG. 4c, intermetal insulating layer 310 is formed on the resultant structure. A first portion of the intermetal insulating layer 310 is removed, thereby forming via holes 315 through the intermetal insulating layer 310 and exposing a portion of the first metal pattern 300. Simultaneously, the second portion of the intermetal insulating layer 310 is removed, thereby defining a second recess 317 through the intermetal insulating layer 310 in the peripheral circuit area. The second recess 317 expose a third portion of the plate electrode 230. The second recess 317 is defined over the fuse 170 and within the first recess 285.

Subsequently, second conductive plugs 320 are formed in the via holes 315. A second metal pattern 330 is formed on the intermetal insulating layer 310 to be electrically connected to a portion of the second conductive plugs 320. On the resultant structure, a passivation layer 340 is formed such that the top surface of the passivation layer 340 within the first recess 285 is lower than the top surface of the plate electrode 230 in the cell array area.

Referring to FIG. 4d, a fuse opening 350a is formed through the passivation layer 340 and the plate electrode 230. In detail, the passivation layer 340 is etched by using the plate electrode 230 as an etch stopper, thereby exposing the plate electrode 230. Subsequently, the plate electrode 230 and the second interlayer insulating layers 180 are etched to expose the fuse 170. The fuse opening 350a is formed through the first and second recesses 285, 317. In the third embodiment of the present invention, the width of the second recess 317 is greater than that of the fuse opening 350a and less than that of the first recess 285.

According to the third embodiment of the invention, the intermetal insulating layer 310 and the third interlayer insulating layer 250 are removed over the fuse 170 to define the first and second recess 285, 317 in the peripheral area. Accordingly, the only layers to be etched for forming the fuse opening 350a are the passivation layer 340, the plate electrode 230 and the second interlayer insulating layers 180. The etching time for forming the fuse opening 350a is relatively short compared to those of the conventional method, the first embodiment and the second embodiment.

In the drawings and specification, there have been disclosed typical preferred embodiments of the invention. Although specific terms are employed, they are used in a generic and descriptive sense only and not for purpose of limitation. It will be understood by those skilled in the art that various changes in the embodiments may be made without departing from the spirit and scope of the invention.

What is claimed is:

1. A method of fabricating a semiconductor device, comprising:

providing a substrate including a first area, a second area and a global step difference between the first and the second areas, wherein the substrate comprises a fuse formed in the second area of the substrate;

forming an interlayer insulating layer on the substrate;

simultaneously removing a first portion of the interlayer insulating layer in the first area and a second portion of the interlayer insulating layer in the second area, thereby decreasing the global step difference and defining a first recess in the interlayer insulating layer in the second area, wherein the first recess is defined over the fuse;

forming a passivation layer on the interlayer insulating layer; and forming a fuse opening on the fuse, wherein the fuse opening is formed through the passivation layer, the interlayer insulating layer and the first recess.

2. The method of claim 1, wherein the first area is a cell array area and the second area is a peripheral circuit area.

3. The method of claim 1, which further comprises planarizing the interlayer insulating layer after defining the first recess.

4. The method of claim 1, wherein the width of the first recess is greater than that of the fuse opening.

5. The method of claim 1, which further comprises:

forming a metal pattern on the interlayer insulating layer;

forming an intermetal insulating layer on the metal pattern; and simultaneously removing a first portion of the intermetal insulating layer, a second portion of the intermetal insulating layer in the second area and a third portion of the interlayer insulating layer in the second area, thereby forming a via hole through the internetal insulating layer and defining a second recess in a composite layer of the interlayer insulating layer and the intermetal insulating layer in the second area, wherein the via holes expose a portion of the metal pattern, and wherein the second recess is defined over the fuse.

6. The method of claim 5, wherein the second recess is defined through the first recess.

7. The method of claim 5, wherein the fuse opening is formed through the second recess.

8. The method of claim 5, wherein the width of the second recess is greater than that of the fuse opening.

9. The method of claim 5, wherein the width of the first recess is greater than that of the second recess.

10. A method of fabricating a semiconductor device, comprising:

providing a substrate including a first area, a second area and a global step difference between the first area and the second area, wherein the substrate comprises a fuse formed in the second area and a conductive layer;

forming an interlayer insulating layer on the substrate;

simultaneously removing a fourth portion of the interlayer insulating layer and a fifth portion of the interlayer insulating layer in the interlayer insulating laver in the second area, thereby forming a contact hole through the interlayer insulating layer and defining a first recess in the second area, wherein the contact hole exposes a first portion of the conductive layer, and wherein the first recess is defined over the fuse;

forming a passivation layer on the interlayer insulating layer;

forming a fuse opening on the fuse, wherein the fuse opening is formed through the passivation layer and the first recess;

forming a conductive plug in the contact hole;

forming a metal pattern on the interlayer insulating layer, wherein the metal pattern is electrically connected to the conductive plug;

forming an intermetal insulating layer on the metal pattern; and simultaneously removing a first portion of the intermetal insulating layer and a second portion of the intermetal insulating layer in the second area, thereby forming a via hole through the intermetal insulating layer and defining a second recess in the intermetal insulating layer in the second area, wherein the second recess is defined over the fuse and exposes a third portion of the conductive layer.

11. The method of claim 10, wherein the second recess is defined within the first recess.

12. The method of claim 10, wherein the width of the second recess is greater than that of the fuse opening.

13. The method of claim 10, wherein the width of the first recess is greater than that of the second recess.

14. The method of claim 10, wherein the step of forming the conductive plug comprises:

forming a plug metal layer in the contact hole; and subjecting the plug metal layer to an etchback under a low RF power.

15. The method of claim 10, wherein the step of forming the conductive plug comprises:

forming a plug metal layer in the contact hole; and subjecting the plug metal layer to a down steam type etchback.

* * * * *

UNITED STATES PATENT AND TRADEMARK OFFICE
CERTIFICATE OF CORRECTION

PATENT NO.    : 6,642,135 B2
DATED         : November 4, 2003
INVENTOR(S)   : Kim et al.

It is certified that error appears in the above-identified patent and that said Letters Patent is hereby corrected as shown below:

Column 4,
Line 18, "interlayer. insulating" should read -- interlayer insulating --.

Column 8,
Line 40, "a second. portion" should read -- a second portion --.

Column 10,
Line 24, "completely. fills" should read -- completely fills --.

Column 11,
Line 53, "the internetal insulating" should read -- the intermetal insulating --.

Signed and Sealed this

Twenty-second Day of June, 2004

JON W. DUDAS
*Acting Director of the United States Patent and Trademark Office*